(12) United States Patent
Matthew et al.

(10) Patent No.: US 6,295,443 B1
(45) Date of Patent: Sep. 25, 2001

(54) AUTOMATIC TUNING AM TRANSMITTER

(76) Inventors: Scott C Matthew, 47 Eastbrook La., Fond du Lac, WI (US) 54935; Tony Robert Esdaile; Michael Robert Milne, both of Mill Studio, Crane mead, Ware, Hertfordshire SG12 9PY (GB)

( * ) Notice: Subject to any disclaimer, the term of this patent is extended or adjusted under 35 U.S.C. 154(b) by 0 days.

(21) Appl. No.: 09/201,366

(22) Filed: Nov. 30, 1998

(51) Int. Cl.[7] .................................................. H03C 1/62
(52) U.S. Cl. ........................ 455/115; 455/120; 455/121
(58) Field of Search .................................. 455/115, 126, 455/127, 120, 121, 123, 125, 129; 333/32

(56) References Cited

U.S. PATENT DOCUMENTS

| | | |
|---|---|---|
| 3,732,496 | 5/1973 | Boyer . |
| 3,794,941 | 2/1974 | Templin . |
| 4,060,808 | 11/1977 | Foldes . |
| 4,112,395 * | 9/1978 | Seward ................................. 455/123 |
| 4,117,493 | 9/1978 | Altmayer . |
| 4,165,487 | 8/1979 | Corderman . |
| 4,234,960 * | 11/1980 | Spilsbury et al. .................... 455/123 |
| 4,538,465 | 9/1985 | Bianchi et al. . |
| 4,620,194 * | 10/1986 | Bel Moratalla ....................... 343/745 |
| 4,726,071 | 2/1988 | Jachowski . |
| 4,817,193 | 3/1989 | Matthew . |
| 5,225,847 * | 7/1993 | Roberts et al. ....................... 455/123 |
| 5,253,511 | 10/1993 | Jaramillo et al. . |
| 5,446,920 | 8/1995 | Matsumoto et al. . |

OTHER PUBLICATIONS

Dwayne L. Kincaid, "An Automatic Antenna Tuner: The AT–11," QST, vol. 80, No. 1, p. 35 (Jan., 1996).

* cited by examiner

Primary Examiner—Curtis Kuntz
Assistant Examiner—Melur Ramakrishnaiah
(74) Attorney, Agent, or Firm—Marshall, O'Toole, Gerstein, Murray & Borun.

(57) ABSTRACT

A radio frequency transmitter having a tunable radio frequency signal generator and an amplifier coupled to the tunable radio frequency signal generator. An aerial is coupled to the amplifier and transmits the amplified radio frequency signal, which may then be received by various radio receivers. The aerial has an output voltage and an impedance. The impedance includes inductive and capacitive reactances. In order to maximize the output voltage of the aerial, an adjustable inductor is coupled to it. The adjustable inductor includes a pair of tuning coils with adjustable ferrite cores. A sampler measures the output voltage of the antenna. The sampled output voltage of the aerial is converted to a digital signal and then compared with a DC reference voltage produced by a processing unit in a comparator. The processing unit is coupled to the comparator and the adjustable inductor and receives the converted signal and analyses its amplitude. The processing unit then sends a signal to the adjustable inductor to adjust the impedance of the coils by moving the ferrite cores in order to maximize the amplitude of the output voltage of the aerial.

13 Claims, 9 Drawing Sheets

AUTOMATIC TUNING AM TRANSMITTER

FIELD OF THE INVENTION

The present invention relates to radio transmitters. More particularly, the present invention relates to a transmitter that automatically adjusts the inductance of the transmitter to match a selected output frequency of the transmitter in order to maximize the output radiated power.

BACKGROUND OF THE INVENTION

There are many instances where information needs to be transmitted quickly and cheaply. Amplitude modulation (or AM) radio transmission can be easily and inexpensively accomplished and, despite some deficiencies, is very attractive for many applications. In particular, new types of highly-specialized, direct radio advertising can be achieved using AM radios. One relatively new application for AM radios is in the sale of real estate.

Recently, real estate of various types, but particularly residential homes, has been equipped with a radio transmitter which broadcasts a pre-recorded message describing the real estate and its features. A prospective buyer may then drive to the property and tune his or her automobile radio to the broadcast frequency of the radio transmitter and listen to the pre-recorded message. The system can operate 24 hours a day, seven days a week until the property is sold. Thus, prospective buyers may gather information at any time, not just those times when the property is open for inspection or when a real estate agent is available to show the property. Furthermore, the system has the ability to reach casual buyers who may not presently be interested in purchasing real estate, but who, if attracted to a property they pass by, may listen to a prerecorded message in their automobile. This initial exposure may lead to a purchase in some cases.

While direct radio marketing broadcasts have certain advantages, such broadcasts must meet certain FCC restrictions related to signal frequency and strength. One of the FCC requirements is that direct marketing broadcasts not interfere with other radio signals such as commercial radio stations. Another consideration to be made when designing a transmitter for real estate sales is that several AM radios might be used in the same geographical area if multiple properties in that area are for sale at the same time. The proximity of many radio signals may cause interference, particularly if the radios broadcast on only one frequency. Thus, a direct marketing radio transmitter must be designed so that the frequency of its broadcast signal can be selected from a range of frequencies depending on the specific placement to be made. However, presently available tunable radio transmitter are inadequate. First, multiknob tuning systems used in some transmitters are cumbersome. Second, in single tuning knob systems the output signal strength varies significantly depending on the broadcast frequency selected. Accordingly, there is a need for an improved radio transmitter that can broadcast a strong signal over a wide range of frequencies.

OBJECTS AND SUMMARY OF THE INVENTION

Therefore, it is an object of the present invention to provide an improved AM transmitter that can broadcast a strong signal over a range of frequencies.

It is another object of the present invention to provide an improved AM transmitter that automatically tunes itself for maximum output by matching a user-selected broadcast frequency.

It is another object of the present invention to provide an improved AM transmitter that can broadcast over a broad range of frequencies, without requiring cumbersome efforts by the user.

These and other objects are achieved in a radio frequency transmitter having a tunable radio frequency signal generator and an amplifier coupled to the tunable radio frequency signal generator. An aerial or antenna is coupled to the amplifier and transmits the amplified radio frequency signal, which may then be received by various radio receivers. The antenna has an output voltage and an impedance. The impedance includes inductive and capacitive reactances.

In order to maximize the output voltage of the antenna, an adjustable inductor is coupled to it. The adjustable inductor includes a pair of wire coils with motor-driven ferrite cores. A sampler measures the output voltage of the antenna and the sampled output voltage of the antenna is converted to a digital signal in an analog-to-digital converter. A processing unit, which is coupled to the converter and the adjustable inductor, receives the converted signal and analyses its amplitude. The processing unit then sends a signal to the adjustable inductor to adjust the impedance of the coils by moving the ferrite cores in order to maximize the amplitude of the output voltage of the antenna.

These are just some of the features and advantages of the present invention. Many others will become apparent by reference to the detailed description of the invention taken in combination with the accompanying drawings.

DETAILED DESCRIPTION

Figure 1:
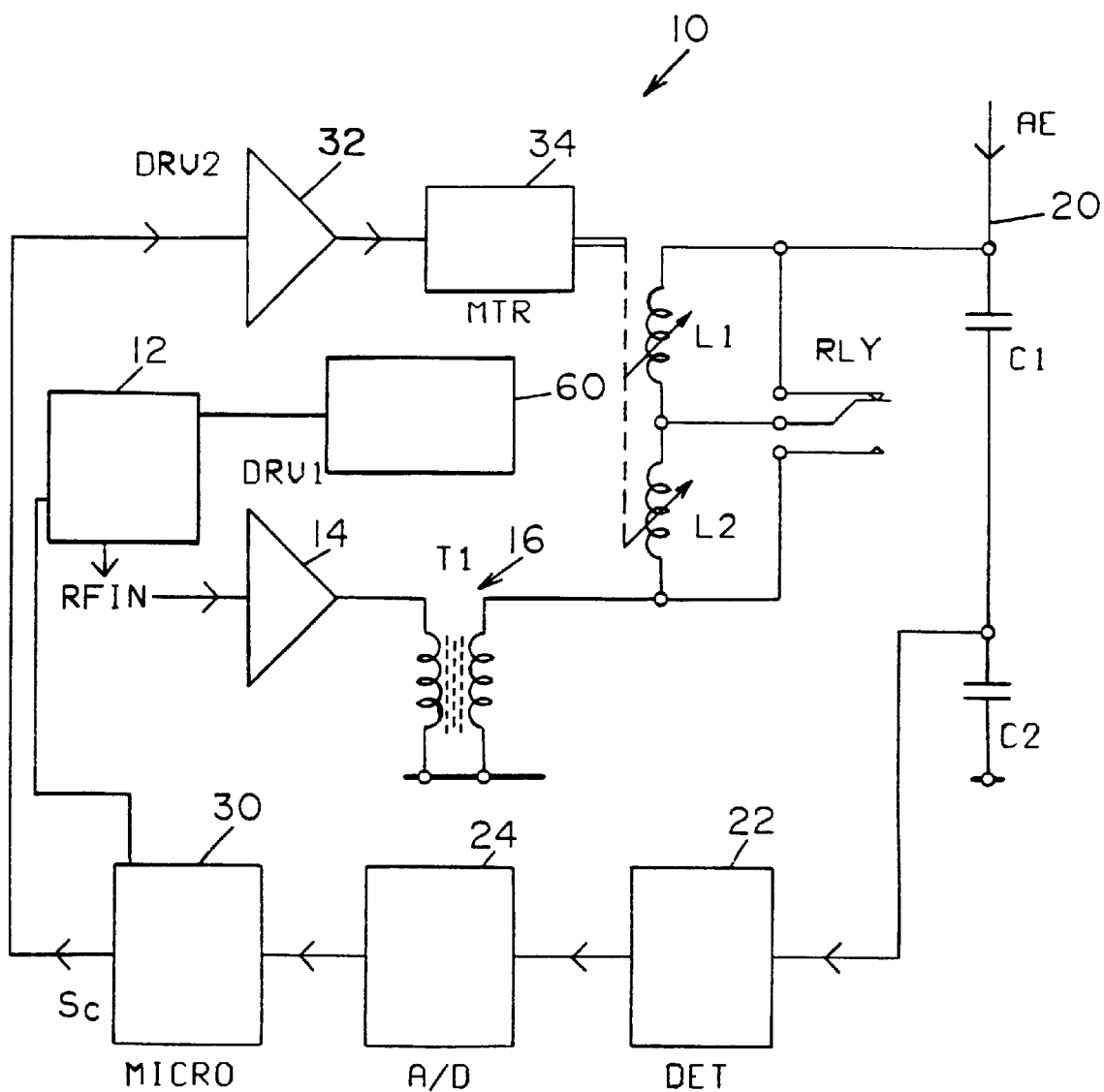
FIG. 1 is a schematic diagram of a transmitter of the present invention.

A transmitter 10 constructed according to the teachings of the present invention is shown schematically in FIG. 1. The transmitter 10 includes a radio frequency (RF) generator 12 which generates an RF signal $RF_{IN}$. The $RF_{IN}$ signal is fed to a power amplifier 14 and through a coupling transformer 16. The signal is then fed from the coupling transformer 16 to a pair of motor-driven coils $L_1$ and $L_2$. The coil $L_1$ is designed to tune to signals from about 1000 kHz to about 1700 kHz and the coil $L_2$ is designed to tune to signals from about 520 kHz to about 1000 kHz. Since the frequency range of each of the coils $L_1$ and $L_2$ is limited, the transmitter 10 can not tune to the second harmonic of the transmission signal. Only the fundamental of the signal can be found. This limitation on the frequency range reduces or eliminates interference with other broadcast services.

The tuned signal from the coils is then fed to an antenna or aerial 20. The output signal of the coils is sampled using capacitors $C_1$ and $C_2$ and rectified using a detector circuit 22. The sampled and rectified signal is converted to a digital signal by an analog-to-digital (A/D) converter 24. The digital signal is then fed into a microprocessor 30. The microprocessor 30 analyzes the level of the digital signal. As will be explained in greater detail below, the microprocessor 30 is programmed to adjust the tuning coils $L_1$ and $L_2$ so that the highest possible voltage is developed on the aerial 20. Specifically, the microprocessor 30 generates a control signal $S_C$ which is delivered to a second power amplifier 32. After the control signal $S_C$ has been amplified, it is delivered to a motor 34 which adjusts the position of two ferrite cores 40 and 42 (FIG. 6) to adjust the inductive reactance of the coils $L_1$ and $L_2$, and, therefore, the amplitude of the output signal of the transmitter 10.

Figure 2:
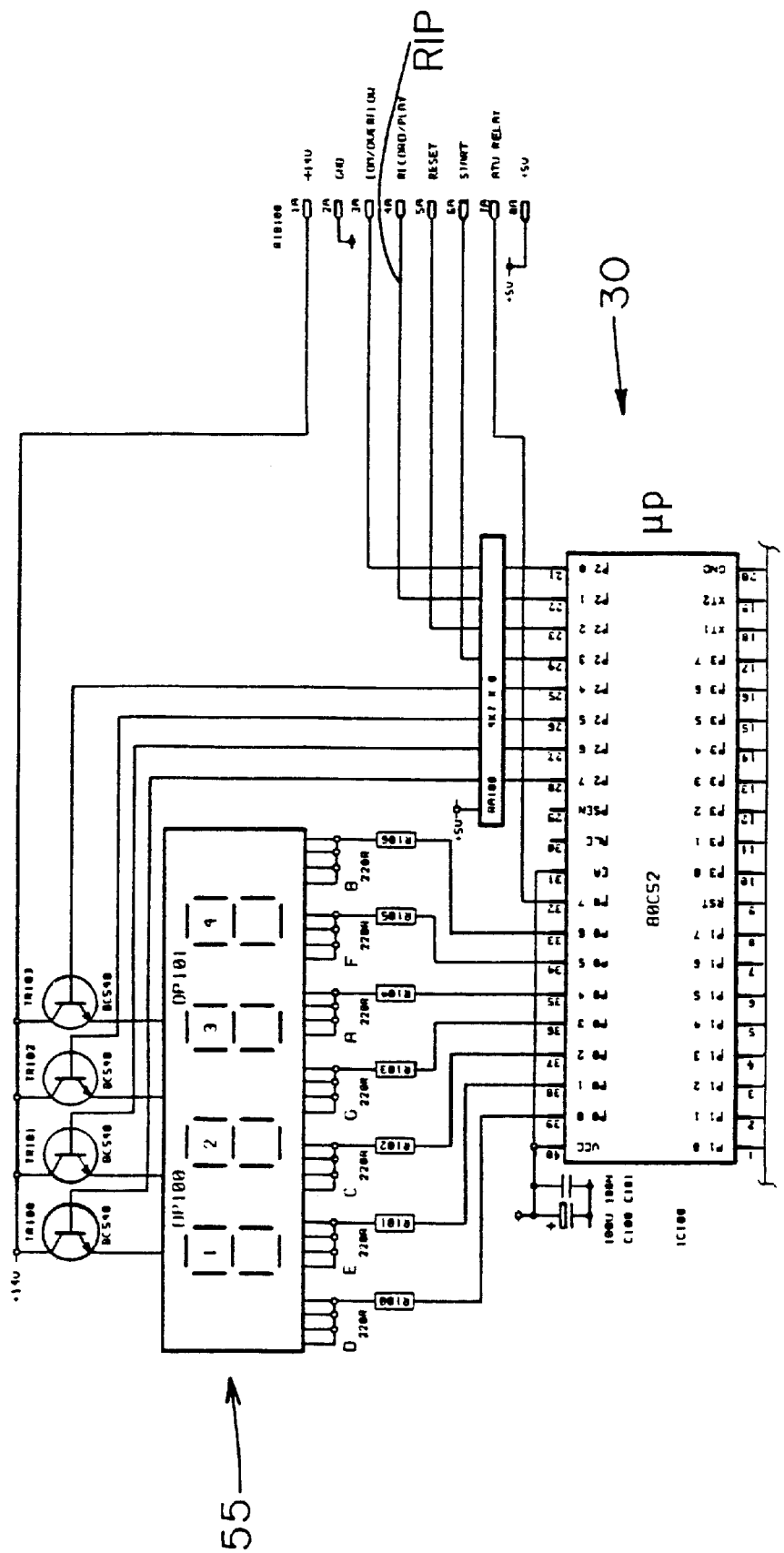
FIG. 2 is a circuit diagram of a microprocessor and its associated circuitry used in the present invention.
Figure 2:
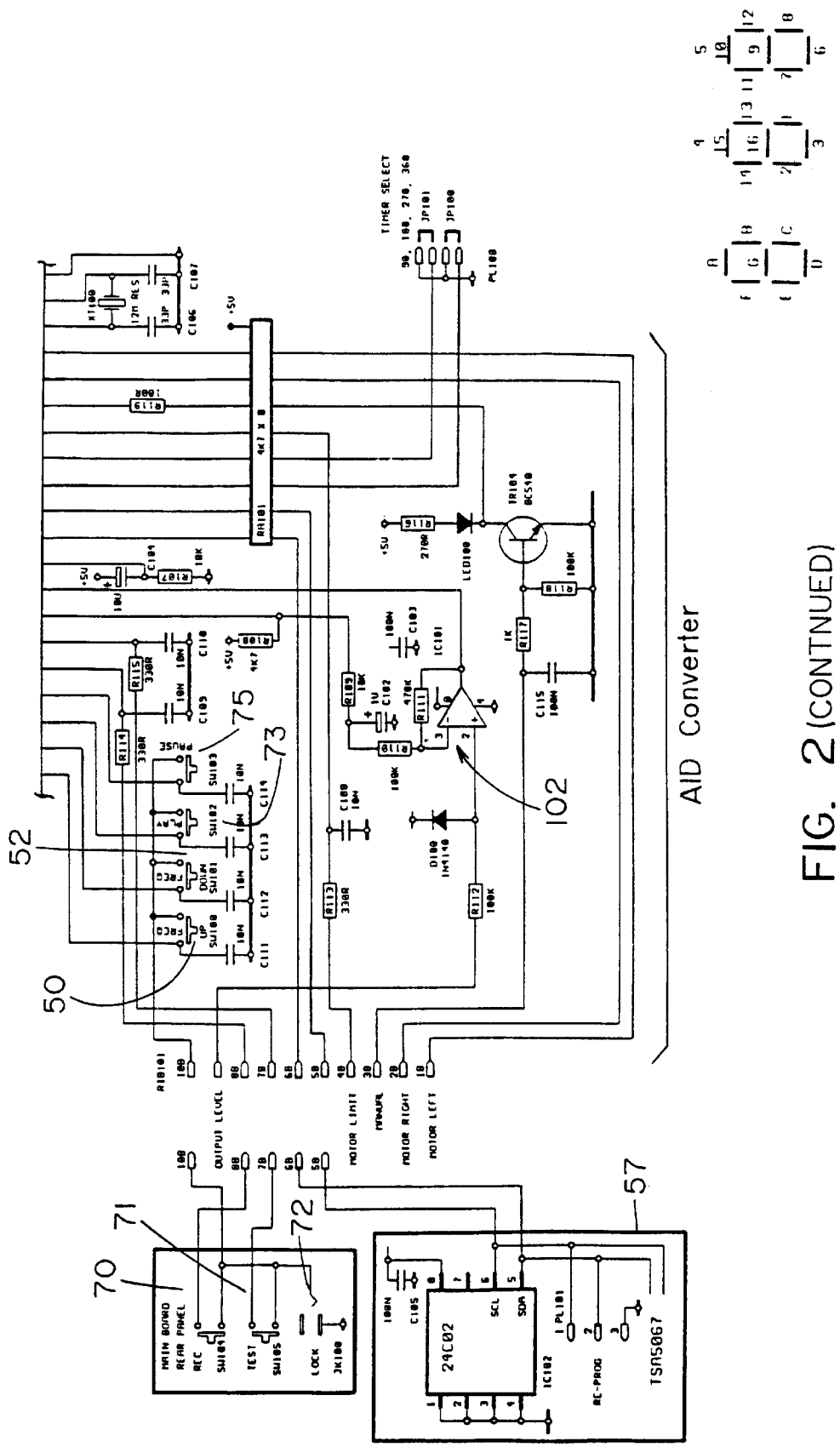
Figure 4A:
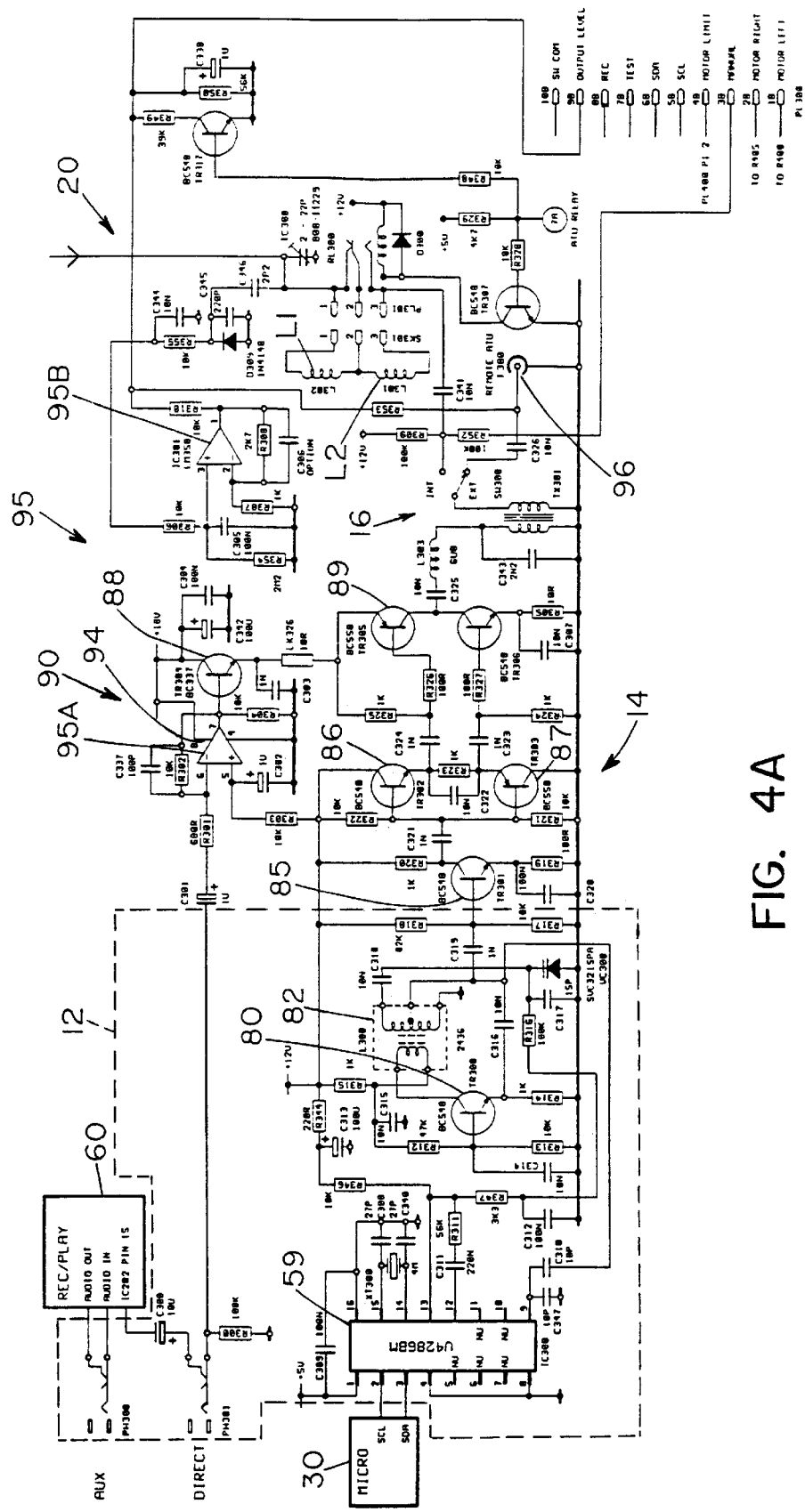
FIG. 4A is a circuit diagram of the transmitter used in the present invention.

Having described the general operation of the transmitter 10, the individual components will be described in more detail. Referring to FIG. 2, the microprocessor 30, which may be any commonly available microprocessor, is designed to accept user input through switches 50 and 52. Using switches 50 and 52, a user may select a desired transmission frequency for the transmitter 10. The transmission frequency is displayed on a seven-segment display 55 and a user may tune up to a higher frequency using the switch 50 and tune down to a lower frequency using the switch 52. The selected frequency is stored in a non-volatile memory 57 and fed to a phase-locked loop (PLL) 59 (FIG. 4A) in the generator 12. As shown in FIG. 4A, the microprocessor 30 and PLL 59 communicate through a serial data line (SDA) and a serial clock line (SCL) (ports 3.0 and 3.1 in FIG. 2).

Figure 3:
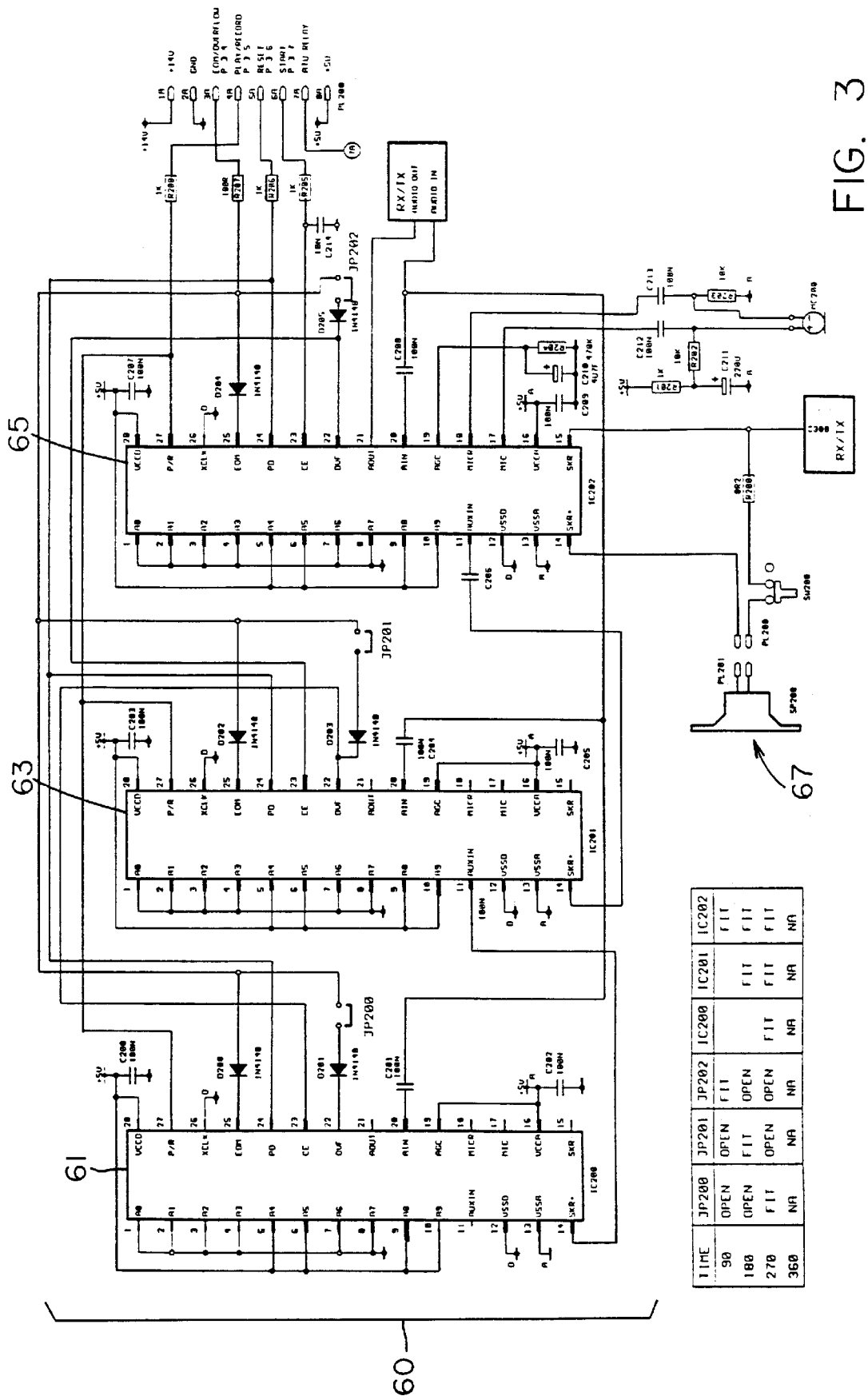
FIG. 3 is a circuit diagram of an audio recording/playback device used in the present invention.

The microprocessor 30 is also coupled by line R/P to a digital record/playback device 60 which consists of three identical record/playback integrated circuits 61, 63, and 65 (FIG. 3). Integrated circuits suitable for use in the present invention may be obtained from Information Storage Devices under model no. ISD 2590. The record/playback device 60 includes a speaker monitor 67 for monitoring the recorded message. The operation of the record/playback device 60 is controlled by five user controlled input switches coupled to the microprocessor 30: record switch 70; test switch 71; lock switch 72; play switch 73, and pause switch 75 (FIG. 2).

Figure 4B:
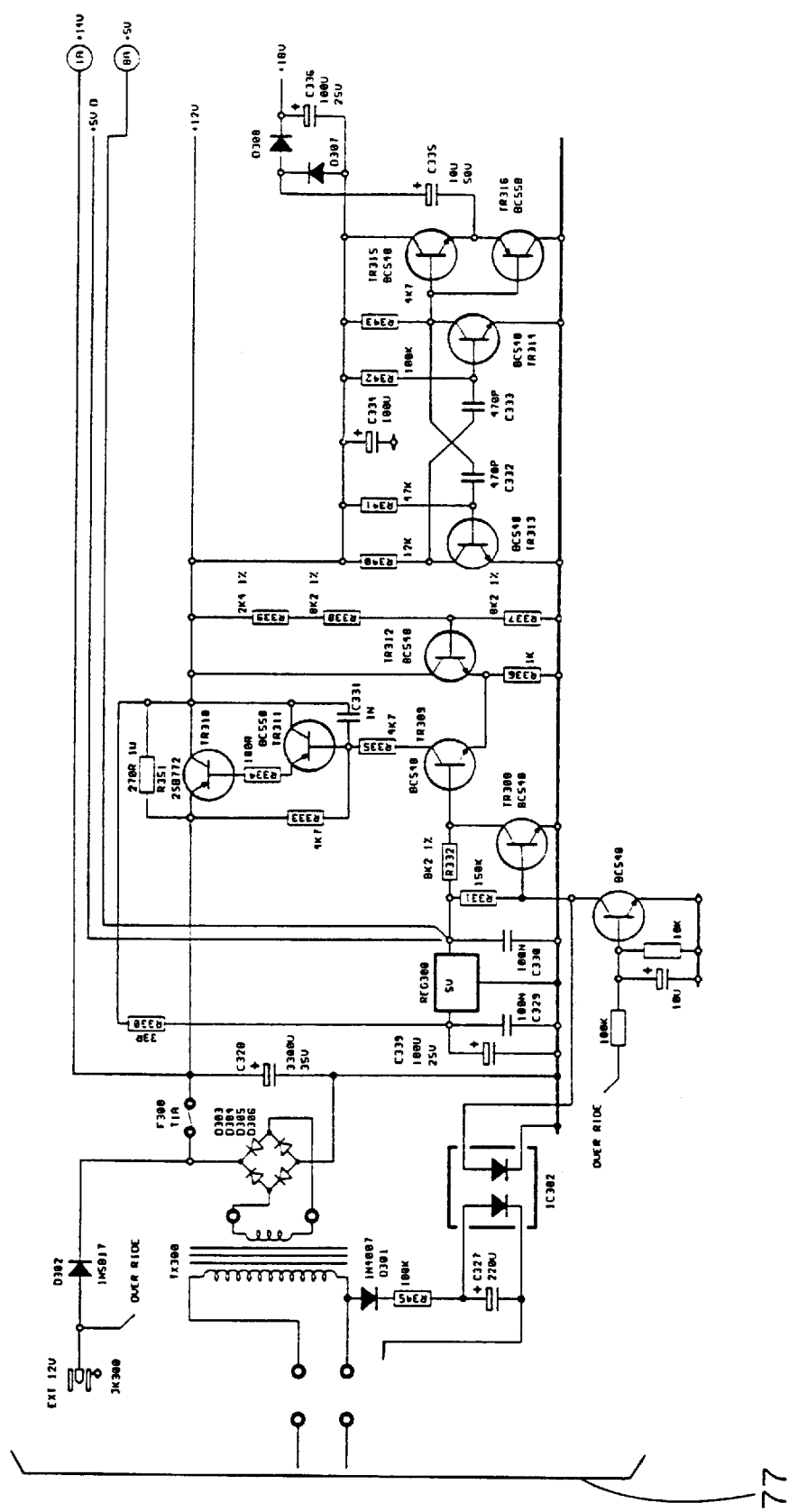
FIG. 4B is a circuit diagram of a power supply unit used in the present invention.
Figure 5:
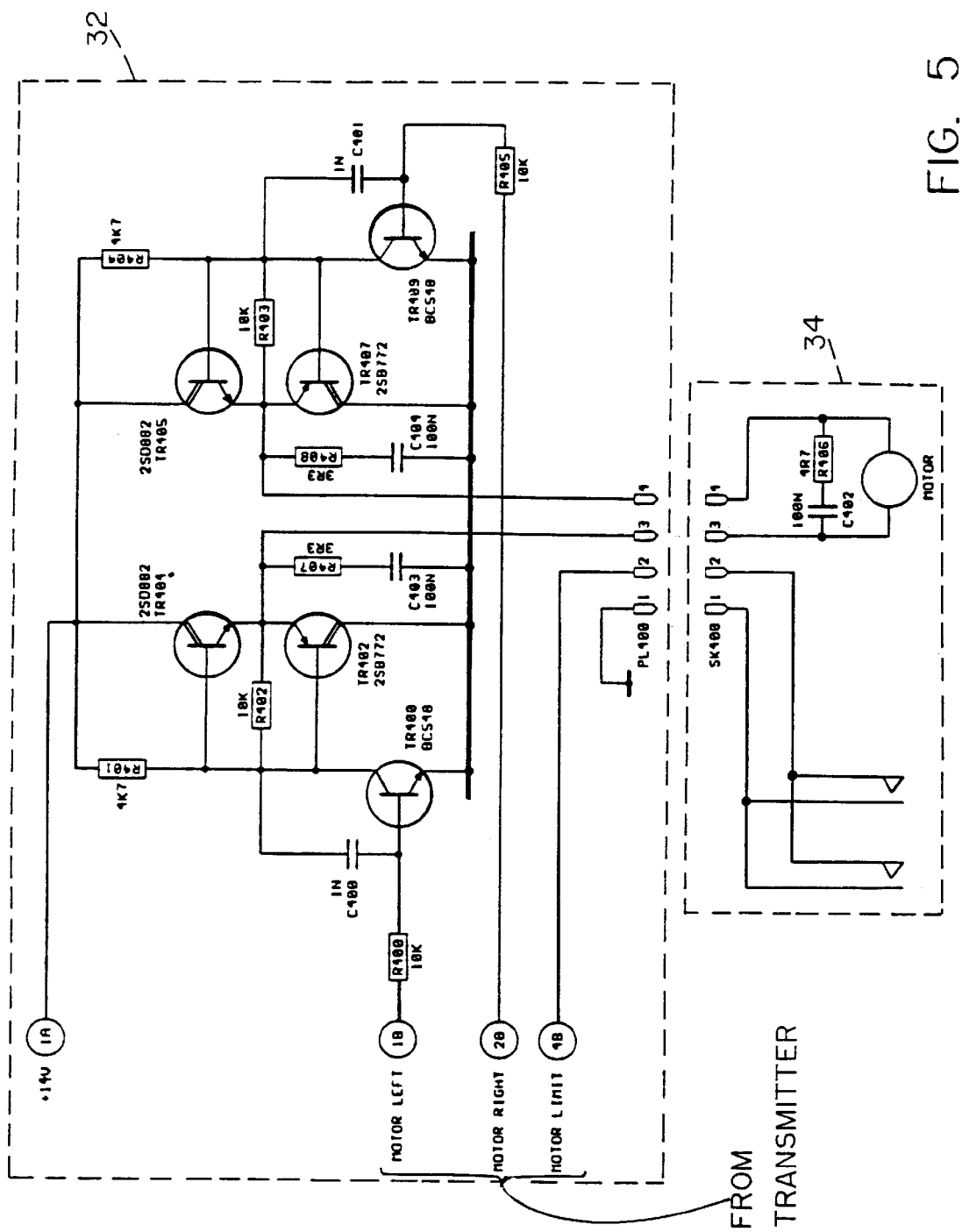
FIG. 5 is a circuit diagram of an amplifier used in the present invention.

As best seen by reference to FIG. 4B, the transmitter 10 includes a power supply unit (PSU) 77. The PSU 77 is of substantially conventional design and, therefore, will not be discussed in detail herein. As should be understood, the PSU 77 supplies power for the generator 12 and other components of the transmitter 10.

As may be seen by reference to FIG. 4A, the PLL 59, transistor 80, and transformer 82 are used to generate the $RF_{IN}$ signal. As indicated above, the $RF_{IN}$ signal is amplified by the power amplifier 14, which includes transistors 85, 86, 87, 88, and 89. The output of the record/playback device is fed to modulator 90 (transistor 88) which is driven by the first stage 95A of a dual operational amplifier 95, which also has a second stage 95B. The modulated audio signal, at the chosen frequency, is then fed to the aerial 20. Alternatively, the modulated audio signal may be fed to a remote aerial (discussed below) through a connector 96.

As noted above, the impedance of the generator 12 is matched to aerial 20 to maximize its output voltage and achieve a high Q or quality factor. The Q of the aerial 20 is the ratio of the resonance frequency to the bandwidth between frequencies on opposite sides of the resonance frequency ("half-power points") where the response of the aerial 20 differs by about 3 decibels from the response level at resonance. The resonance-excitation frequency equals the natural frequency of the circuit. By adjusting the impedance of the aerial 20, the natural frequency of the transmitter can be adjusted so that resonance or near resonance occurs at the user-selected broadcast frequency, resulting in the highest possible output. More specifically, the inductive reactance $R_L$ of the coils $L_1$ and $L_2$ is adjusted by moving the ferrite cores 40 and 42.

Movement of the cores 40 and 42 is controlled by the microprocessor 30 using a feedback loop. As indicated, the microprocessor 30 controls the PLL 59. In order to set the oscillation frequency of the PLL 59, the output voltage of the generator 12 is fed to the aerial 20 and, as best seen by reference to FIGS. 1 and 4, fed back to the microprocessor 30. The signal is sampled via a capacitor 100, rectified to DC, and amplified by the second stage 95B of the operational amplifier 95.

Using the feed-back it receives, the microprocessor 30 generates a variable pulse-width signal which is integrated to give a variable DC reference voltage for a comparator 102 (FIG. 2). When the comparator 102 changes state, the microprocessor 30 knows that the aerial DC reference voltage equals the DC reference voltage generated by the microprocessor 30. Using this information, the microprocessor 30 raises its reference DC voltage while moving the cores 40 and 42, checking for an equal increase in the aerial DC reference voltage. There comes a point where the aerial DC reference voltage falls relative to the microprocessor DC reference voltage. At that point, the microprocessor 30 knows that the optimum has been passed and reverses the core movement to find the actual peak.

While monitoring the output of antenna 20, the microprocessor 30 drives the motor 34 to move the ferrite cores 40 and 42 of the tuning coils $L_1$ and $L_2$. The microprocessor 30 is programmed to monitor the Q of the aerial 20. When the Q of the aerial 20 reaches a maximum, the microprocessor 30 turns the motor 30 off, fixing the cores 40 and 42 in position. As noted above, the coils $L_1$ and $L_2$ are designed to be tuned to different frequencies. Thus, only one of the coils is active at a time. A relay 110 controls which of the coils $L_1$ or $L_2$ is energized. The relay 110 is controlled by the microprocessor 30, which upon sensing the desired input frequency set by the user will pick the appropriate coil to use, depending on whether the input frequency falls within the range of coil $L_1$ (about 1000 kHz to about 1700 kHz) or coil $L_2$ (about 520 kHz to about 1000 kHz).

Figure 6:
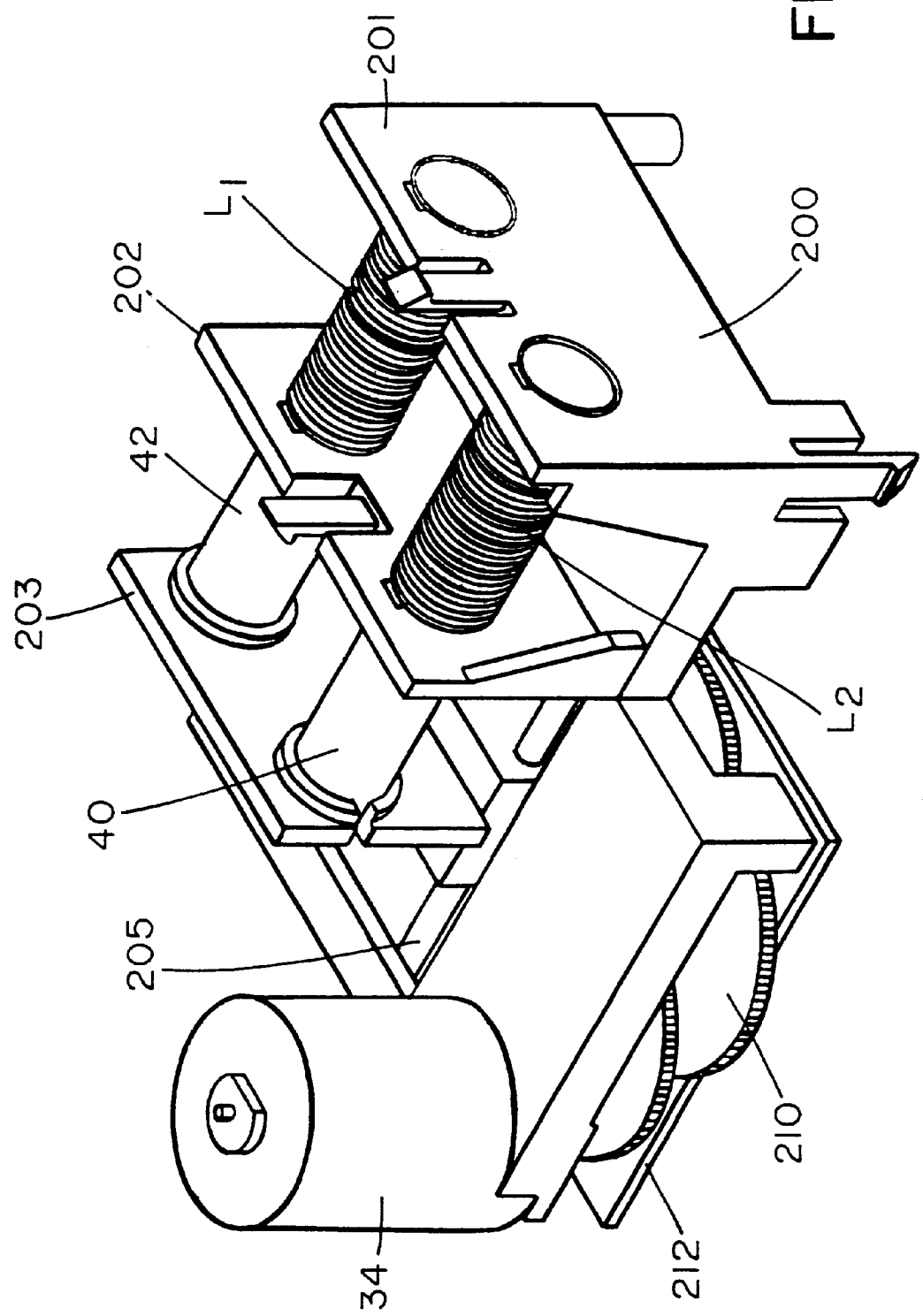
FIG. 6 is a perspective view of the motor and adjustable inductive coils used in the present invention.

As seen in FIG. 6, the tuning coils $L_1$ and $L_2$ are mounted on a support structure 200 having two end plates 201 and 202. The ferrite cores 40 and 42 are mounted on a carriage 203 which rides on a pair of tracking bars 205. The carriage 203 is engaged by a gear 207 which is driven by the motor 34 through a gear chain 210 which is supported by a bearing plate 212. Depending on the control signal sent to the motor 34, the ferrite cores 40 and 42 are moved into or out of the inductive coils $L_1$ and $L_2$.

Figure 7:
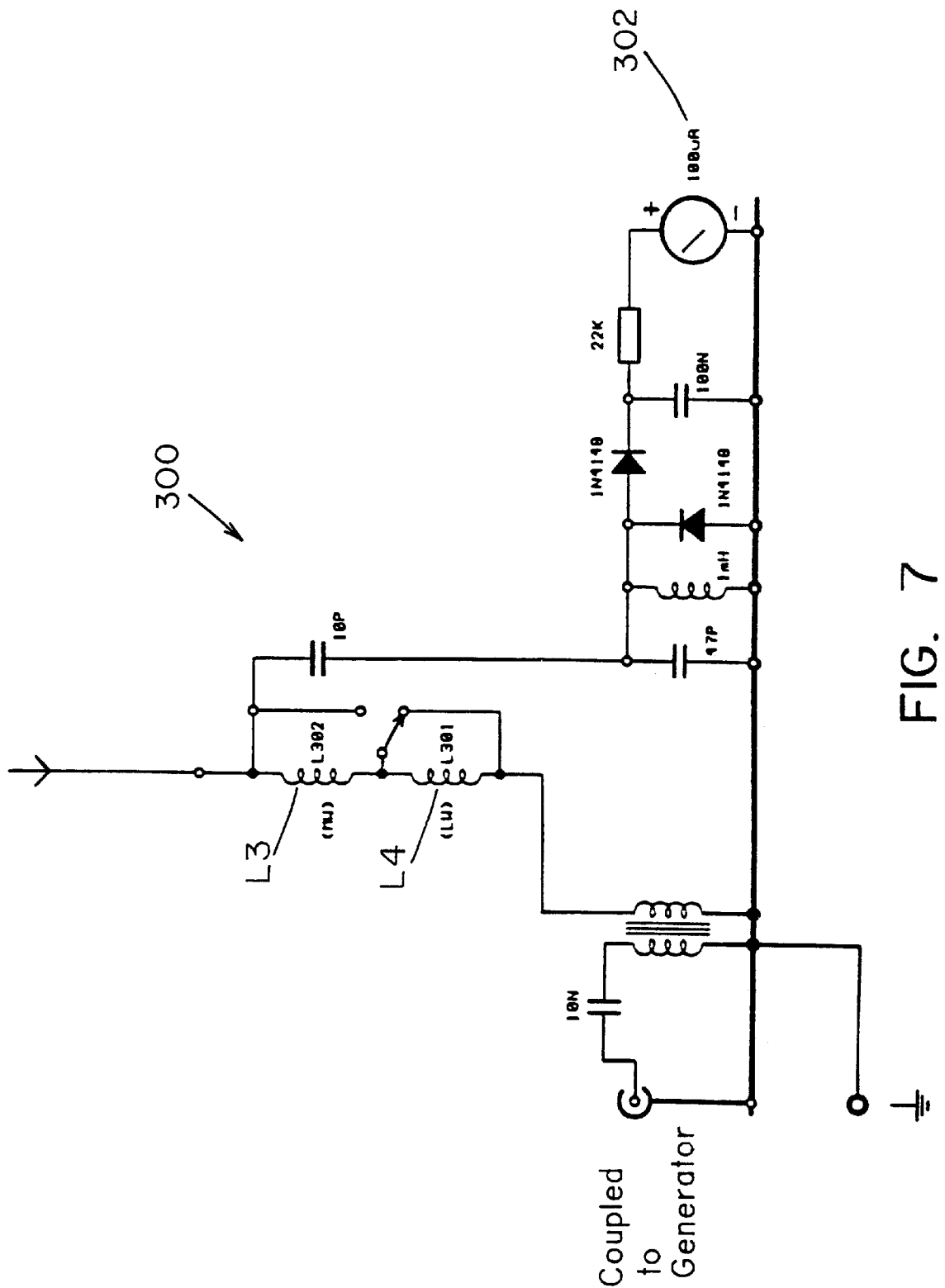
FIG. 7 is a circuit diagram of a remote aerial used in the present invention.

As indicated above, in an alternative embodiment of the present invention a remote aerial 300 (FIG. 7) may be coupled to the generator 12 through the connector 96 in place of the aerial 20. The remote aerial 300 includes a voltmeter 302 and two coils $L_3$ and $L_4$. Using the meter 302, the coils $L_3$ and $L_4$ may be tuned manually to mimic the automatic tuning of the aerial 20. The remote aerial 300 is particularly useful for those circumstances where the building in which the transmitter unit is placed shields or screens radio signals that are broadcast from inside of it.

While the present invention has been described in what is believed to be the most preferred forms, it is to be understood that the invention is not confined to the particular examples and arrangement of the components herein illustrated and described, but embraces such modified forms thereof as come within the scope of the appended claims.

What is claimed is:

1. A low frequency radio frequency transmitter adapted to automatically adjust aerial impedance for a selected radio frequency signal, the radio frequency transmitter comprising:

a tunable radio frequency signal generator having an impedance for generating a radio frequency signal in the range of approximately 520 kilohertz to approximately 1700 kilohertz;

an aerial coupled to the tunable radio frequency generator to transmit the radio frequency signal, the aerial having an output voltage and an aerial impedance;

an adjustable inductor coupled to the aerial to match the impedance of the signal generator to the aerial impedance;

a sampler coupled to the aerial to measure the aerial's output voltage; and a processing unit coupled to the sampler and the adjustable inductor, the processing unit, responsive to the measured aerial output voltage, iteratively increasing the impedance of the adjustable inductor until the measured aerial output voltage ceases increasing thereby matching the aerial impedance to the radio frequency signal generator impedance.

2. A radio frequency transmitter as in claim 1, wherein the adjustable inductor includes a first tuning coil and a second tuning coil.

3. A radio frequency transmitter as in claim 2, wherein each tuning coil includes a ferrite core mounted on a motor driven carriage.

4. A radio frequency transmitter as in claim 2, wherein the frequency range of the first and second tuning coils is limited so that the transmitter cannot tune to harmonics of the radio frequency signal.

5. A radio frequency transmitter as in claim 1, further comprising a record/playback device coupled to the tunable radio frequency generator.

6. A radio frequency transmitter as in claim 1, further comprising an amplifier coupled between the tunable radio frequency generator and the antenna.

7. A method of matching an aerial impedance with a generator impedance of a low frequency radio transmitter, the method comprising the steps of:

selecting a low frequency radio transmission frequency from a range of approximately 520 kilohertz to approximately 1700 kilohertz;

measuring an aerial output voltage at the selected radio transmission frequency on a periodic basis;

automatically incrementally increasing the magnitude of an aerial impedance on a periodic basis until the measured aerial output voltage has a magnitude that is less than a magnitude of a previously measured aerial output voltage; and decreasing the magnitude of the aerial impedance until the measured aerial output voltage is substantially equal to the previously measured aerial output voltage.

8. The method of claim 7, wherein the step of automatically incrementally increasing the aerial impedance further includes incrementally increasing the inductance of an adjustable inductor coupled to the aerial.

9. The method of claim 7, further including the step of storing the measured aerial output voltage as a previously measured aerial output voltage prior to incrementally increasing the aerial impedance.

10. A method of matching an aerial impedance with a generator impedance of a low frequency radio transmitter, the method comprising the steps of:

selecting a low frequency radio transmission frequency;

measuring an aerial output voltage at the selected radio transmission frequency on a periodic basis;

automatically incrementally increasing the inductance of an adjustable inductor coupled to the aerial by adjusting the inductance of a first coil when the selected radio transmission frequency is within a range of approximately 520 kilohertz to approximately 1000 kilohertz and adjusting the inductance of a second coil when the selected radio transmission frequency is within a range of approximately 1000 kilohertz to approximately 1700 kilohertz on a periodic basis until the measured aerial output voltage has a magnitude that is less than a magnitude of a previously measured aerial output voltage; and decreasing the magnitude of the aerial impedance until the measured aerial output voltage is substantially equal to the previously measured aerial output voltage.

11. A method of automatically adjusting aerial impedance to match generator impedance in a low frequency radio frequency transmitter, the method comprising the steps of:

(a) selecting a low frequency radio transmission frequency from a range of frequencies from approximately 520 kilohertz to approximately 1700 kilohertz;

(b) measuring an aerial output voltage at the selected radio transmission frequency;

(c) generating and storing a reference aerial output voltage which is greater than the measured aerial output voltage;

(d) increasing the aerial impedance based on the reference aerial output voltage;

(e) measuring the aerial output voltage at the adjusted aerial impedance;

(f) comparing the measured aerial output voltage at the adjusted aerial impedance to the reference aerial output voltage;

(g) if the measured aerial output voltage is substantially equal to the reference aerial output voltage, storing the reference aerial output voltage as a previous reference aerial output voltage;

(h) repeating steps (c) through (g) until the measured aerial output voltage is less than the reference aerial output voltage; and (i) adjusting the aerial impedance so that the measured aerial output voltage substantially equals the previous reference aerial output voltage.

12. The method of claim 11, wherein the step of increasing the aerial impedance further includes adjusting the inductance of an adjustable inductor coupled to the aerial.

13. The method of claim 12, wherein the step of increasing the aerial impedance further includes adjusting the inductance of a first coil when the selected radio transmission frequency is within a range of approximately 520 kilohertz to approximately 1000 kilohertz and adjusting the inductance of a second coil when the selected radio transmission frequency is within a range of approximately 1000 kilohertz to approximately 1700 kilohertz.

* * * * *